(12) United States Patent
Chen et al.

(10) Patent No.: US 12,324,123 B2
(45) Date of Patent: Jun. 3, 2025

(54) PARTITION DEVICE WITH AIRFOIL-SHAPED AIRFLOW DEFLECTORS

(71) Applicant: Quanta Computer Inc., Taoyuan (TW)

(72) Inventors: Chao-Jung Chen, Taoyuan (TW); Yu-Nien Huang, Taoyuan (TW); Jen-Hui Wang, Taoyuan (TW)

(73) Assignee: QUANTA COMPUTER INC., Taoyuan (TW)

(*) Notice: Subject to any disclaimer, the term of this patent is extended or adjusted under 35 U.S.C. 154(b) by 440 days.

(21) Appl. No.: 17/813,433

(22) Filed: Jul. 19, 2022

(65) Prior Publication Data

US 2023/0345663 A1    Oct. 26, 2023

Related U.S. Application Data

(60) Provisional application No. 63/333,015, filed on Apr. 20, 2022.

(51) Int. Cl.
*H05K 7/20* (2006.01)
*F15D 1/12* (2006.01)

(52) U.S. Cl.
CPC ........... *H05K 7/20145* (2013.01); *F15D 1/12* (2013.01)

(58) Field of Classification Search
CPC .......... H05K 7/20572; H05K 7/20736; H05K 7/20145; H05K 7/20745; H05K 7/20836; H05K 7/20172; H05K 7/206; H05K 7/20727; H05K 7/1488; H05K 7/18; H05K 7/20009; H05K 7/20536; H05K 7/0041; H05K 7/20754; H05K 7/20554
See application file for complete search history.

(56) References Cited

U.S. PATENT DOCUMENTS

| | | | |
|---|---|---|---|
| 5,734,552 A | 3/1998 | Krein | |
| 6,104,608 A * | 8/2000 | Casinelli | F24F 13/24 181/224 |
| 11,172,591 B2 | 11/2021 | Anderl et al. | |
| 2003/0047365 A1* | 3/2003 | Jain | B60K 11/08 180/68.1 |
| 2004/0217072 A1* | 11/2004 | Bash | H05K 7/20718 361/692 |
| 2010/0006276 A1 | 1/2010 | Cremaschi et al. | |
| 2012/0009862 A1 | 1/2012 | Meyer | |
| 2017/0316133 A1 | 11/2017 | Abramov | |

OTHER PUBLICATIONS

TW Office Action for Application No. 111133832, mailed Mar. 6, 2023, w/ First Office Action Summary.
TW Search Report for Application No. 111133832, mailed Mar. 6, 2023, w/ First Office Action.

* cited by examiner

*Primary Examiner* — Edelmira Bosques
*Assistant Examiner* — Michael James Giordano
(74) *Attorney, Agent, or Firm* — NIXON PEABODY LLP

(57) ABSTRACT

A partition device for improving cooling of a heat-generating electronic device includes a grid panel and an airflow deflector. The grid panel has one or more apertures and a thickness that extends from a leading surface to a trailing surface. The apertures of the grid panel extend parallel to an airflow direction of forced air flowing across the thickness of the grid panel and through the apertures. The airflow deflector is attached at least in part within one of the apertures, and the airflow deflector has an airfoil shape for reducing air resistance between the forced air and the grid panel. The airfoil shape has a leading edge that redirects initial contact with the forced air and a trailing edge that continues redirecting the forced air.

9 Claims, 8 Drawing Sheets

PARTITION DEVICE WITH AIRFOIL-SHAPED AIRFLOW DEFLECTORS

RELATED APPLICATIONS

This application claims priority to and the benefit of U.S. Provisional Application No. 63/333,015, filed on Apr. 20, 2022, which is incorporated herein by reference in its entirety.

FIELD OF THE INVENTION

The present invention relates generally to an electronic chassis for improving cooling of a heat-generating device, and more specifically, to a partition device for improving cooling of a heat-generating electronic device that is enclosed within an electronic chassis.

BACKGROUND OF THE INVENTION

Many computer systems, and especially server systems, include heat-generating electronic devices that require cooling for proper and efficient working condition. The concern with cooling is particularly acute when the electronic devices are encased in a chassis. Typically, the electronic devices are equipped with fans for ventilation; heated air generated by the electronic devices is expelled by fans through ventilation grids in the chassis. However, the sharp rectangular vent openings on conventional ventilation grids abruptly contract and expand the airflow passageway, causing disruption to the airflow and increasing airflow resistance. Consequently, conventional ventilation grids reduce efficiency of the cooling fans and detrimentally affect the cooling of the heat-generating electronic devices.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a partition device for improving cooling of a heat-generating electronic device includes a grid panel and an airflow deflector. The grid panel has one or more apertures and a thickness that extends between a leading surface and a trailing surface. The apertures of the grid panel extend parallel to an airflow direction of forced air flowing across the thickness of the grid panel and through the apertures. The airflow deflector is attached at least in part within one of the apertures, and the airflow deflector has an airfoil shape for reducing air resistance between the forced air and the grid panel. Furthermore, the airfoil shape has a leading edge that redirects initial contact with the forced air and a trailing edge that continues redirecting the forced air.

According to another aspect of the partition device described above, the leading edge of the airflow deflector extends from the leading surface of the grid panel towards the airflow direction.

According to another aspect of the partition device described above, the trailing edge of the airflow deflector extends from the trailing surface of the grid panel away from the airflow direction.

According to another aspect of the partition device described above, the airfoil shape of the airflow deflector is symmetrically biconvex.

According to another aspect of the partition device described above, the airflow deflector has a length and a thickness. The length is defined by distance of a chord line that runs from the leading edge to the trailing edge. The thickness is defined by the longest distance between the biconvex surfaces of the airflow deflector in a plane perpendicular to the chord line. A ratio of the length to the thickness is between about 1.01 and about 25.

According to another aspect of the partition device described above, the airfoil shape of the airflow deflector includes a convex surface that redirects flow of the forced air, and an attachment surface that attaches the airflow deflector to an aperture. The attachment surface is opposite the convex surface.

According to another aspect of the partition device described above, the airflow deflector matches a first airflow deflector and the partition device further includes a second airflow deflector. The second airflow deflector is attached at least in part within the aperture to which the first airflow deflector is attached. The second airflow deflector has an airfoil shape for reducing air resistance between the forced air and the grid panel. The airfoil shape of the second airflow deflector has a leading edge that redirects initial contact with the forced air, a trailing edge that continues redirecting the forced air and an opposing convex surface facing a convex surface of the first airflow deflector.

According to another aspect of the partition device described above, the convex surface of the first airflow deflector and the opposing convex surface of the second airflow deflector are separated by a gap distance. The gap distance is configured to create a low-pressure region between the convex surface of the first airflow deflector and the opposing convex surface of the second airflow deflector. The air pressure of the low-pressure region is lower than air pressure near the leading surface of the grid panel.

According to another aspect of the partition device described above, the aperture extends longitudinally along the leading surface and the trailing surface of the grid panel. The airflow aperture includes a top, a midsection and a bottom.

According to another aspect of the partition device described above, the airflow deflector matches a middle deflector that is attached to the midsection of the airflow aperture. The middle deflector has a biconvex airfoil shape. The partition device further includes an upper deflector and a lower deflector. The upper deflector and the lower deflector are attached to the top and the bottom of the airflow aperture, respectively. The upper deflector and the lower deflector each have an airfoil shape for reducing air resistance between the forced air and the grid panel. The airfoil shape of the upper deflector and the lower deflector each have a leading edge that redirects initial contact with the forced air, a trailing edge that continues redirecting the forced air, and a convex surface facing the middle deflector.

According to other aspects of the present disclosure, a method is directed to improving cooling of a heat-generating electronic device. The method includes positioning an airflow deflector within an aperture of a grid panel that is located within a computer chassis. The airflow deflector has an airfoil shape. The method also includes causing forced air to pass through the aperture of the grid panel. The method further includes, in response to the forced air making contact with the airflow deflector, redirecting the forced air around the airfoil shape to reduce air resistance between the forced air and the grid panel.

According to another aspect of the method described above, the aperture of the grid panel extends longitudinally along a surface of the grid panel. The surface of the grid panel is perpendicular to an airflow direction of the forced air.

According to another aspect of the method described above, the airflow deflector matches a first airflow deflector and the method further includes positioning a second airflow deflector within the aperture of the grid panel. The second airflow deflector also has an airfoil shape. The method also includes configuring a convex surface of the first airflow deflector to face an opposing convex surface of the second airflow deflector.

According to other aspects of the present disclosure, the method described above further includes separating the convex surface of the first airflow deflector and the opposing convex surface of the second airflow deflector by a gap distance. The gap distance is configured to create a low-pressure region between the convex surface of the first airflow deflector and the opposing convex surface of the second airflow deflector. The air pressure of the low-pressure region is lower than air pressure near a leading surface of the grid panel. The method also includes causing the low-pressure region to draw forced air through the aperture.

According to other aspects of the present disclosure, an electronic chassis for improving cooling of a heat-generating electronic device includes one or more panels. Each panel has a one or more apertures and one or more of deflectors for reducing air resistance between airflow through the apertures and the grid panels. Each aperture has a longitudinal shape across the panel in a first plane and extends through the thickness of the respective panel. The first plane is perpendicular to a direction of airflow through the apertures. Each panel also has a thickness that extends across a second plane that is parallel to the direction of the airflow. Each deflector has an airfoil shape and at least a portion of each deflector is positioned within one of the apertures. Each deflector has a leading edge and a trailing edge. The leading edge has a blunt shape that redirects initial contact with the airflow and the trailing edge has a sharp shape that continues redirecting the airflow after passing through the respective aperture.

According to another aspect of the electronic chassis described above, the electronic chassis further includes a frame for encasing the heat-generating electronic device. The frame has one or more frame walls that define an interior space. The panels are distributed across the interior space in a direction parallel to the second plane.

According to another aspect of the electronic chassis described above, the airfoil shape of at least one of the airflow deflectors is symmetrically biconvex.

According to another aspect of the electronic chassis described above, the deflector with symmetrically biconvex airfoil shape has a length and a thickness. The length is defined by distance of a chord line between the leading edge and the trailing edge. The thickness is defined by the longest distance between the biconvex surfaces of the airflow deflector in a plane perpendicular to the chord line. The ratio of the length to the thickness is between about 1.01 and about 25.

According to another aspect of the electronic chassis described above, the airfoil shape of at least some of the deflectors include a convex surface that reduces resistance between the airflow and the grid panel, and an attachment surface that attaches the airflow deflector to the respective aperture. The attachment surface is opposite the convex surface.

According to another aspect of the electronic chassis described above, at least one of the apertures has a top, a midsection, and a bottom. An upper deflector, a middle deflector and a lower deflector are attached to the top, the midsection and the bottom of the airflow aperture, respectively. The middle deflector has a biconvex airfoil shape. The upper deflector and the lower deflector each has a convex surface facing the middle deflector.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
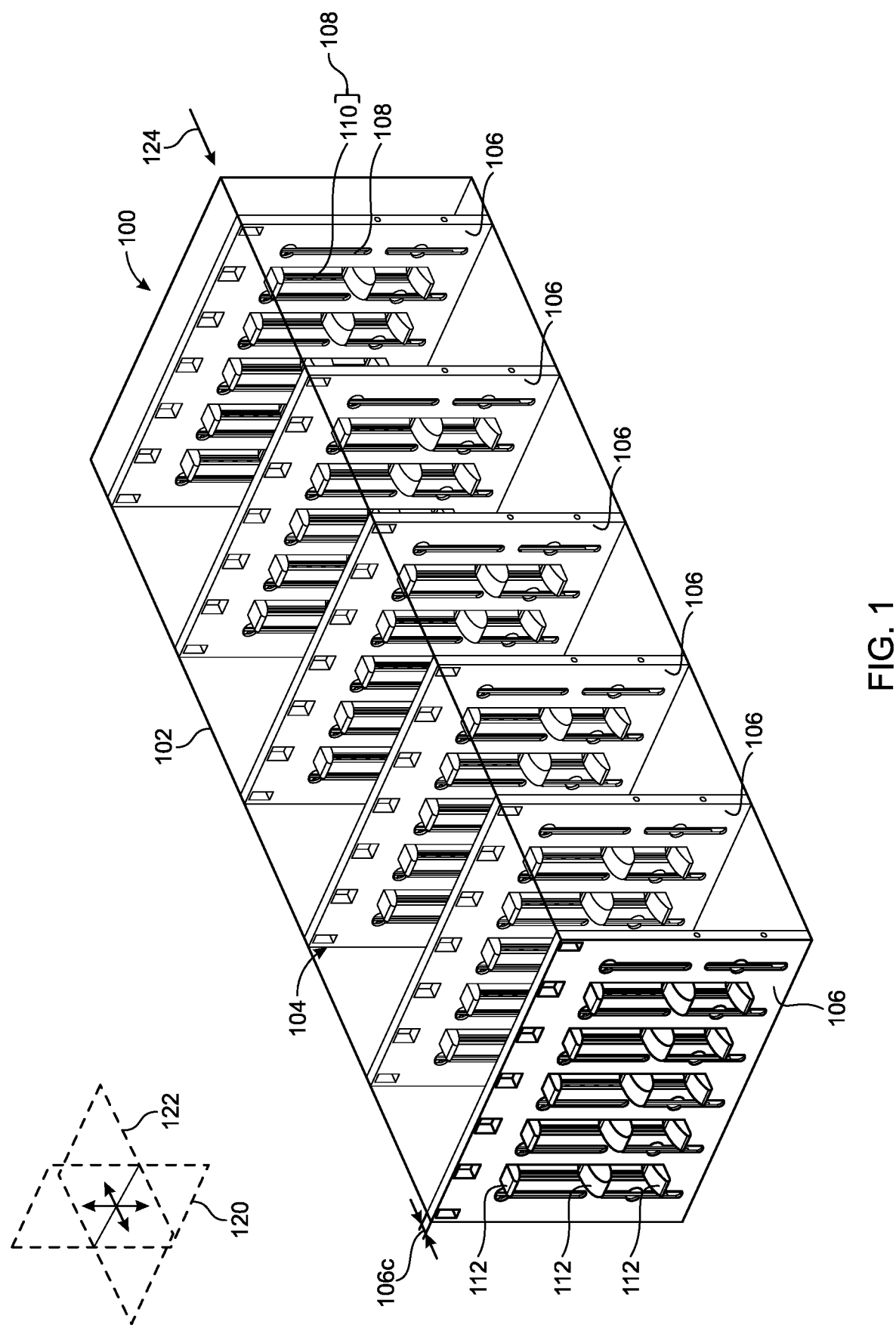
FIG. 1 is an isometric view illustrating internal aspects of an electronic chassis, which is fitted with partition devices for improving cooling of one or more heat-generating electronic devices, according to certain aspects of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Generally, an embodiment of the present invention is directed to a partition device for improving cooling of a heat-generating electronic device. The partition device includes a grid panel and an airflow deflector. The grid panel has one or more apertures and a thickness that extends from a leading surface to a trailing surface. The apertures of the grid panel extend parallel to an airflow direction of forced air flowing across the thickness of the grid panel and through the apertures. The airflow deflector is attached at least in part within one of the apertures. The airflow deflector also has an airfoil shape for reducing air resistance between the forced air and the grid panel. The airfoil shape has a leading edge that redirects initial contact with the forced air and a trailing edge that continues redirecting the forced air.

The present invention also discloses an electronic chassis that includes one or more of the above-described partition device and a method for improving cooling of a heat-generating electronic device using the above-described partition device.

FIG. 1 shows an electronic chassis 100 with partition devices 104 for improving cooling of one or more heat-generating electronic devices (not shown) mounted within the chassis 100. The heat-generating electronic device mounted within the chassis 100 may be a server, computer, switch, router, storage device, telecommunication component and the like that requires air-based cooling. The electronic chassis 100 includes a frame 102 and one or more partition devices 104. The partition devices 104 each include a grid panel 106. According to some of the embodiments, each grid panel 106 has one more apertures 108. Some of these apertures 108 are airflow apertures 110 that are fitted with one or more airflow deflectors 112. According to some embodiments, each airflow aperture 110 has a longitudinal shape across a first plane 120 of its respective panel 106 and extends through the thickness 106c of the respective panel 106. The first plane 120 is perpendicular to a direction of airflow 124 through the apertures 108. The thickness 106c of each panel 106 extends across a second plane 122 that is parallel to the direction of airflow 124. At least a portion of each airflow deflector 112 is positioned within one of the airflow apertures 110. Furthermore, each airflow deflector 112 has an airfoil shape for reducing air resistance between airflow and the one or more grid panels 106 as forced air expelled by one or more heated electronic devices (not shown) moves through the airflow apertures 110.

Figure 2A:
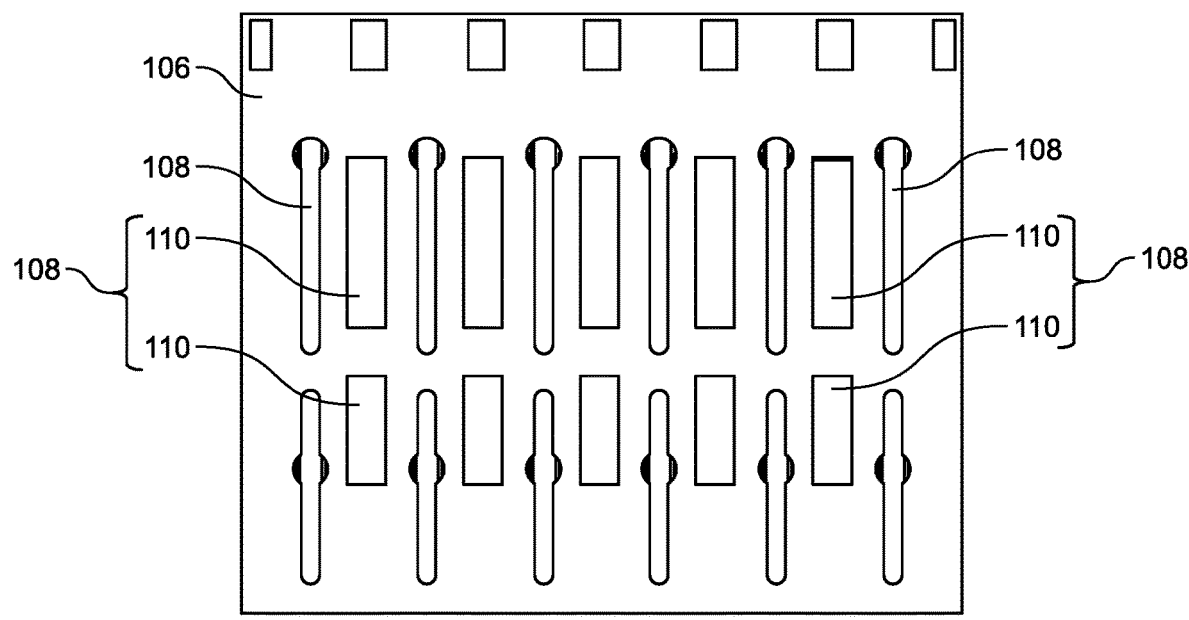
FIG. 2A is a front view of a grid panel, which is included in a partition device of the electronic chassis of FIG. 1, according to other aspects of the present disclosure.
Figure 2B:
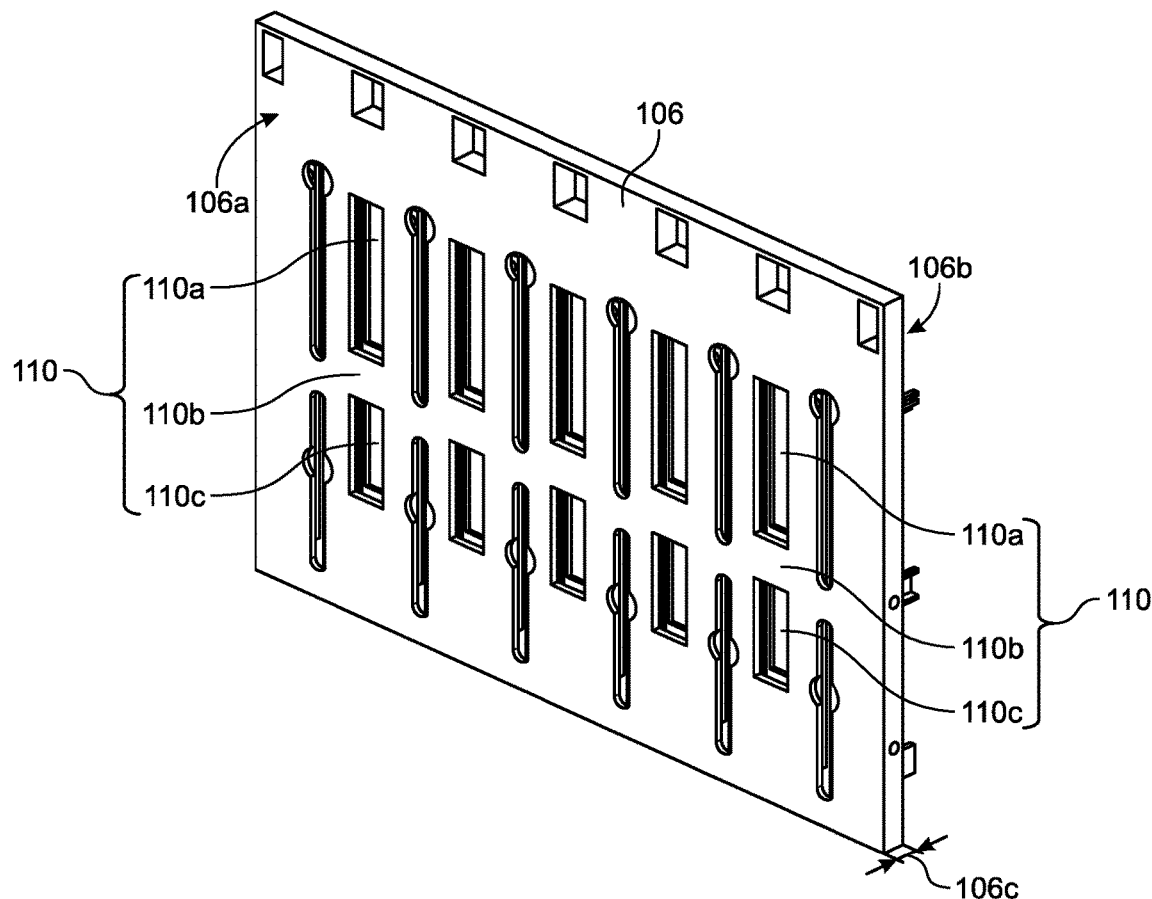
FIG. 2B is a perspective view of the grid panel of FIG. 2A.

FIGS. 2A and 2B show a grid panel 106 of the partition device 104 (shown in FIG. 1) without the airflow deflectors. Referring to FIG. 2A, the grid panel 106 has one or more apertures 108. In some embodiments, a subset of the apertures 108 are airflow apertures 110 designed to facilitate the flow of forced air expelled from one or more heat-generating electronic devices. FIG. 2B further shows that, in some embodiments, the airflow apertures 110 are longitudinally-shaped and extend through the thickness 106c of the grid panel 106 from a leading surface 106a to a trailing surface 106b. The longitudinally-shaped airflow apertures 110 each have a top 110a, a midsection 110b, and a bottom 110c. It should be recognized that each airflow aperture 110 does not have to be a contiguous opening. For instance, the midsection 110b of some airflow apertures 110 could be partially filled and be used as an attachment point for an airflow deflector.

Figure 3A:
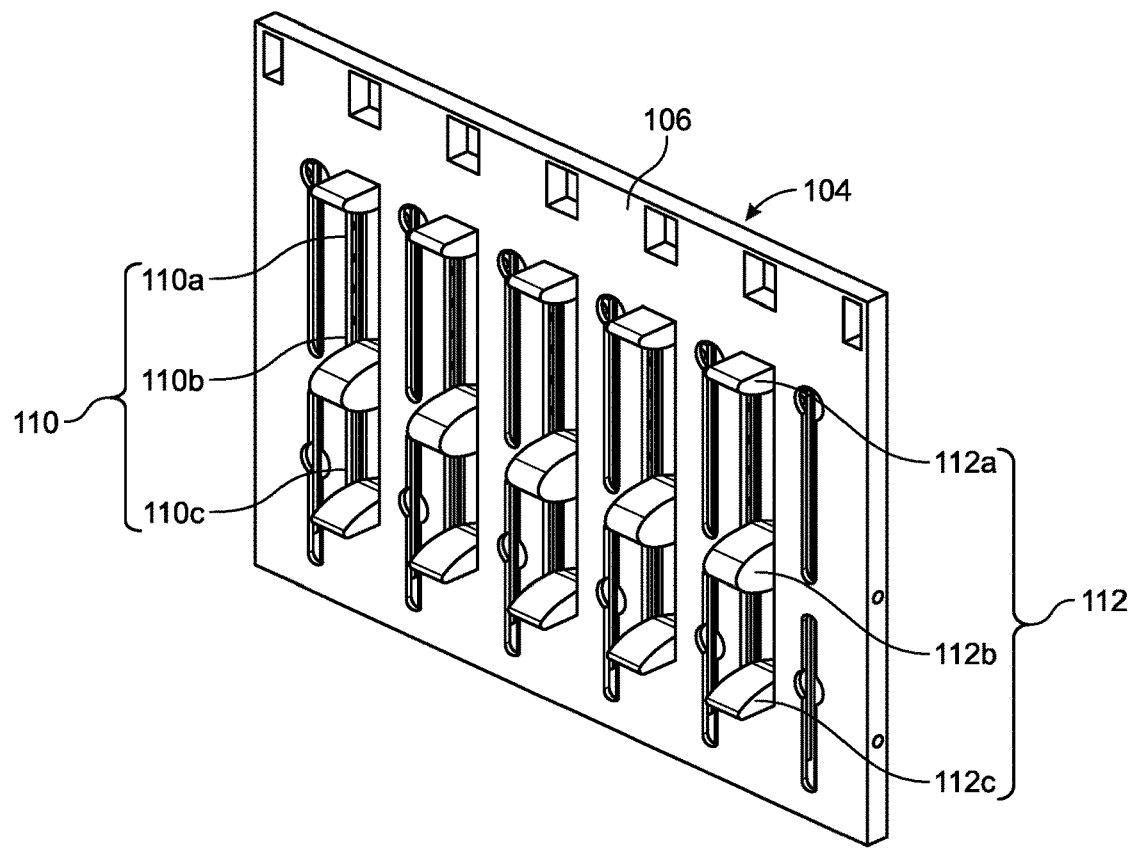
FIG. 3A is a perspective view of a partition device, which is included in the electronic chassis of FIG. 1.

FIG. 3A illustrates an embodiment of the partition device 104. The partition device 104 includes the grid panel 106 shown in FIGS. 2A and 2B, as well as one or more airflow deflectors 112. In some embodiments, the airflow deflectors 112 include an upper deflector 112a, a middle deflector 112b and a lower deflector 112c, each respectively fitted to the top 110a, the midsection 110b and the bottom 110c of an airflow aperture 110. Furthermore, the airflow deflectors 112 could be configured such that each of the middle deflectors 112b has a biconvex airfoil shape, and each of the upper deflectors 112a and the lower deflectors 112c has a convex surface facing the respective middle deflector 112b.

It should be recognized that an airflow aperture 110 may have fewer or more airflow deflectors 112 than that is shown in FIG. 3A. Furthermore, as mentioned above, the airfoil shape of the deflectors 112 improves flow of the forced air through the apertures 110 by reducing the air resistance between the forced air and the grid panel 106. Thus, the specific airfoil shape of the airflow deflectors 112 can also be varied, such as by modifying the convex curvature of the airfoil shape or adjusting an aspect ratio between the length and the thickness of the airfoil shape.

Figure 3B:
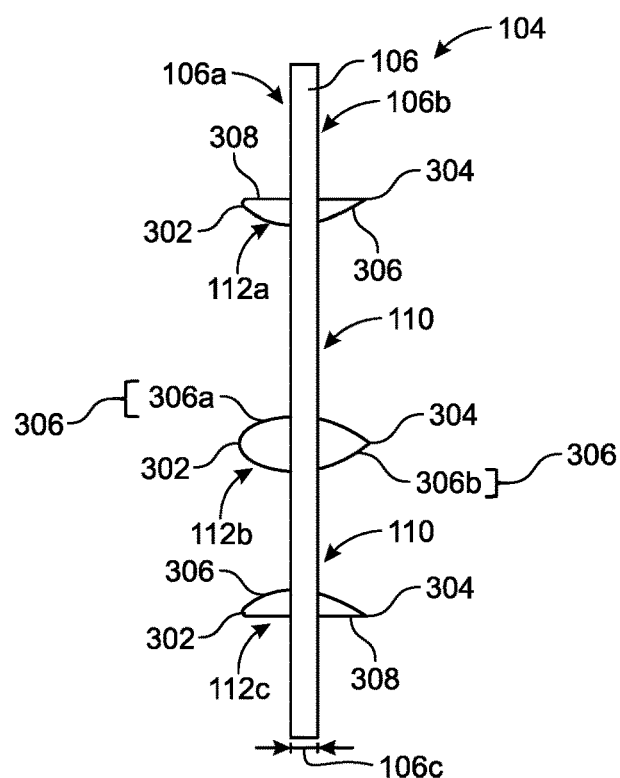
FIG. 3B is a side view of the partition device of FIG. 3A.

Referring to FIG. 3B, the partition device 104 is shown from a side view and a set of the airflow deflectors 112a, 112b, and 112c are illustrated and described in more detail. Each of the airflow deflectors 112a, 112b, and 112c is attached at least in part within an airflow aperture 110. Each airflow deflector has an airfoil shape for reducing air resistance between the forced air and the grid panel 106. The airfoil shape has a leading edge 302 that redirects initial contact with the forced air, and a trailing edge 304 that continues redirecting the forced air. In some embodiments, the leading edge 302 of each airflow deflector 112a, 112b, and 112c extends from the leading surface 106a of the grid panel 106 towards the airflow direction. In some embodiments, the trailing edge 304 of each airflow deflector 112a, 112b, and 112c extends from the trailing surface 106b of the grid panel 106 away from the airflow direction. In some embodiments, the airfoil shape of the middle deflector 112b is symmetrically biconvex, with an upper convex surface 306a and a lower convex surface 306b joined at the leading edge 302 and the trailing edge 304. On the other hand, the airfoil shape of the upper deflector 112a and the lower deflector 112c only includes one convex surface 306. According to some embodiments, each of the upper deflector 112a and the lower deflector 112b have an attachment surface 308 opposite the respective convex surface 306. The attachment surface 308 in this instance is a flat surface, however it is not restricted to being so. The upper deflector 112a and the lower deflector 112b are attached to the top 110a and the bottom 110c of the airflow aperture 110, respectively. The upper deflector 112a and the lower deflector 112c are configured such that their convex surfaces 306 face the upper convex surface 306a and the lower convex surface 306b, respectively.

Figure 4A:
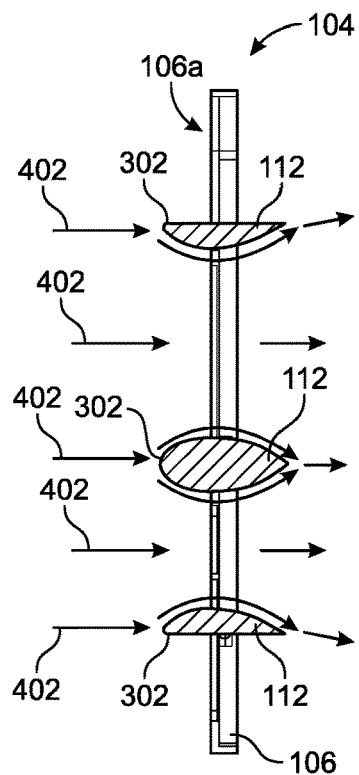
FIG. 4A is a side view of the partition device of FIG. 3A, illustrating airflow direction and air pressure regions.
Figure 4B:
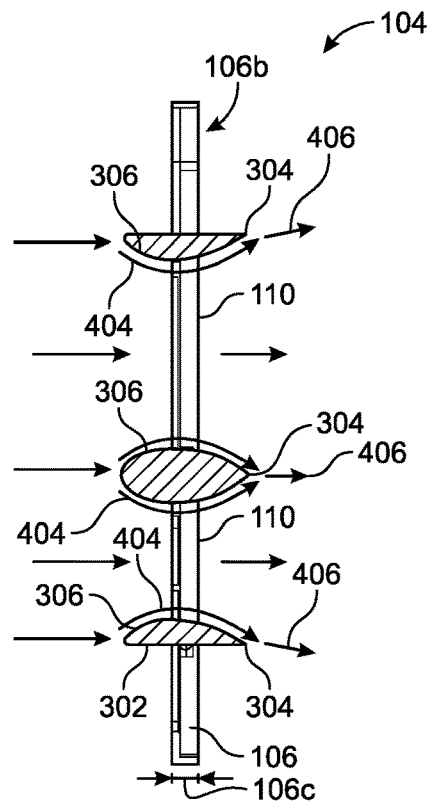
FIG. 4B is another side view of the partition device of FIG. 3A, illustrating the airflow direction and the air pressure regions.

FIGS. 4A and 4B show side views of the partition device 104, with arrows added to indicate the direction of airflow as the forced air interacts with the airflow deflectors 112. Referring specifically to FIG. 4A, forced air expelled by one or more heat-generating electronic devices (not shown) flows in a direction 402 approximately perpendicular to the grid panel 106 and makes contact with both the leading surface 106a of the grid panel 106 and the leading edges 302 of the airflow deflectors 112. The blunt leading edges 302 of the airflow deflectors 112 redirect initial contact with the airflow. Referring specifically to FIG. 4B, after the forced air contacts the airflow deflectors 112, the airfoil shapes of the airflow deflectors 112a, 112b, and 112c cause the forced air to attach as attached air 404 to the convex surfaces 306 of the deflectors 112 and postpones the separation of the forced air 406 until it has reached the trailing edges 304 of the airflow deflectors 112. Resultantly, the airflow deflectors 112 are able to guide the forced air through the aperture 110 smoothly. Furthermore, the airflow deflectors 112 mitigate disruption to airflow that is caused by a sudden contraction and expansion of the airflow passageway, as in the case of conventional ventilation grids.

Figure 4C:
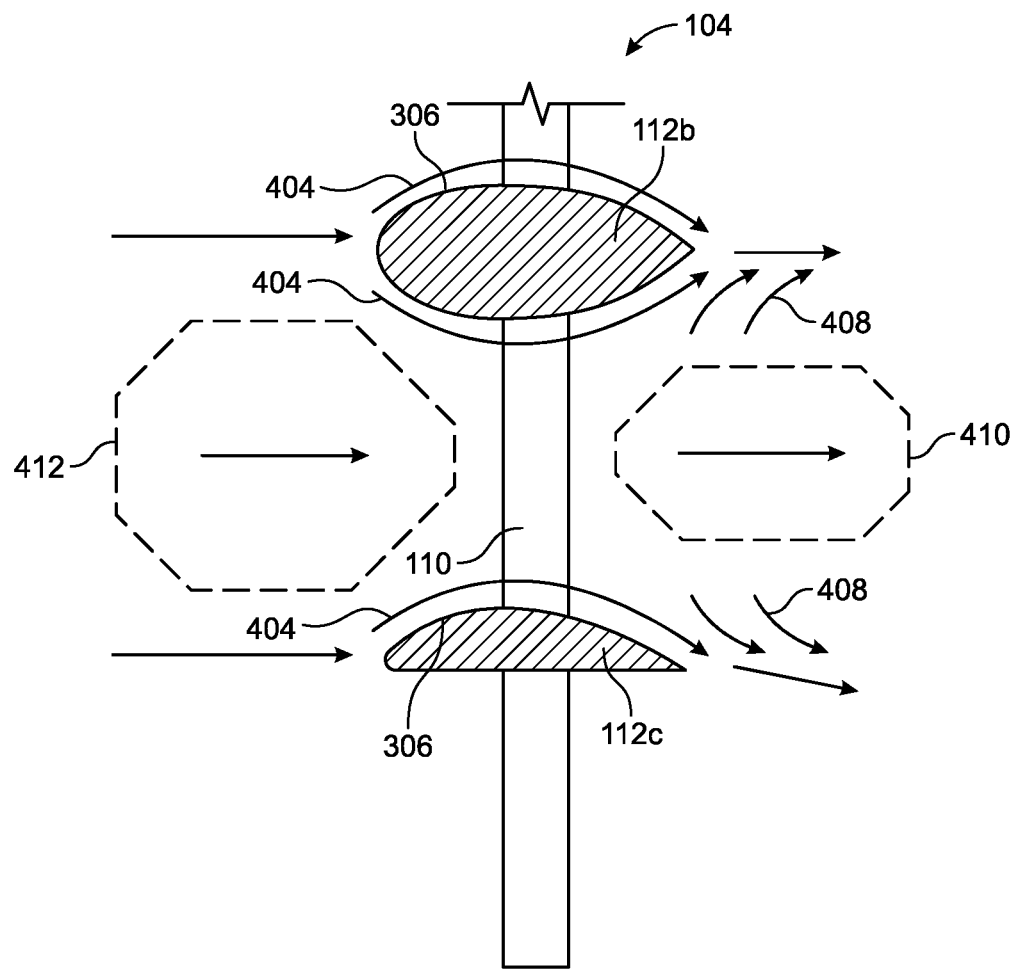
FIG. 4C is an enlarged, partial side view of the partition device of FIG. 3A, illustrating the airflow direction and the air pressure regions.

FIG. 4C shows a side view of a portion of the partition device 104. The arrows indicate the direction of airflow and the regions delimited by dashed lines indicate air pressure regions. According to an embodiment, the forced air stays attached to and travels along the convex surfaces 306 of the airflow deflectors 112b and 112c as attached air 404. The attached air 404 behaves as a fluid jet and causes air from the immediate surroundings to become entrained air 408. This in turn creates a low-pressure region 410 in the immediate surroundings where air was pulled away from. By having two airflow deflectors 112b and 112c positioned at least in part within an airflow aperture 110, and having a convex surface 306 of one airflow deflector 112b facing a convex surface 306 of the other airflow deflector 112c, a low-pressure region 410 is created between the two airflow deflectors 112b and 112c. This configuration further improves airflow by drawing forced air through the aperture 110 from a region of higher air pressure 412 to the low-pressure region 410.

Figure 5:
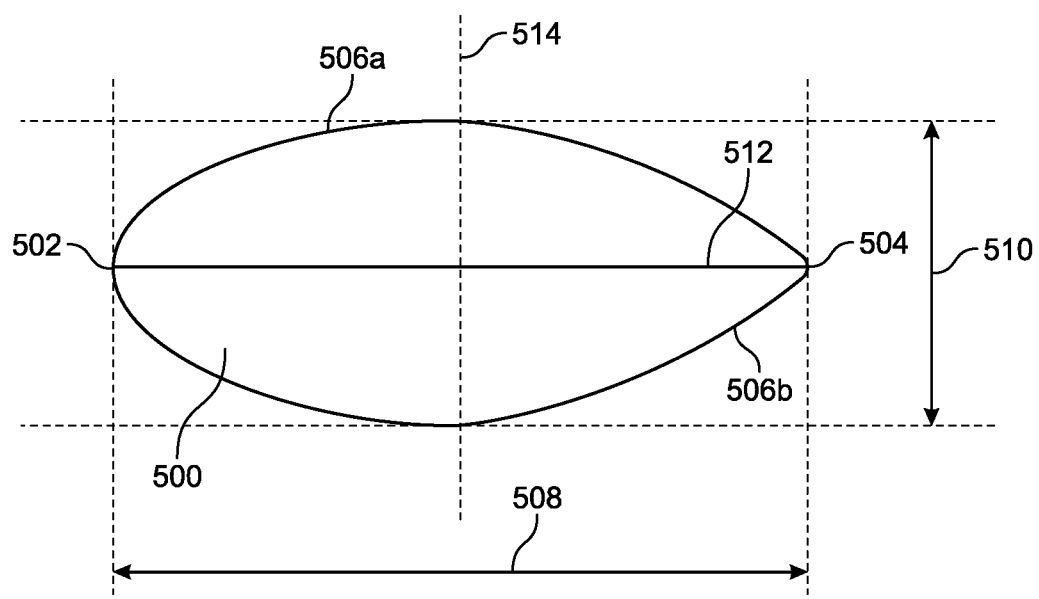
FIG. 5 is a cross-sectional side illustration of a symmetrically biconvex airflow deflector, according to an aspect of the present disclosure.

Referring to FIG. 5, the airfoil shape and aspect ratio of a symmetrically biconvex deflector is described in detail. A symmetrically biconvex deflector 500 has a blunt leading edge 502, a sharp trailing edge 504, and two outwardly facing convex surfaces 506a and 506b that are joined at the leading edge 502 and the trailing edge 504. The deflector 500 has a length 508 and a thickness 510. The length 508 is the distance of a chord line 512, which is a straight line that runs from the leading edge 502 to the trailing edge 504. The thickness 510 is the longest distance between the convex surfaces 506a and 506b in a plane 514 that is perpendicular to the chord line 512. In some embodiments, a ratio of the length 508 to the thickness 510 is between about 1.01 and about 25.

Figure 6A:
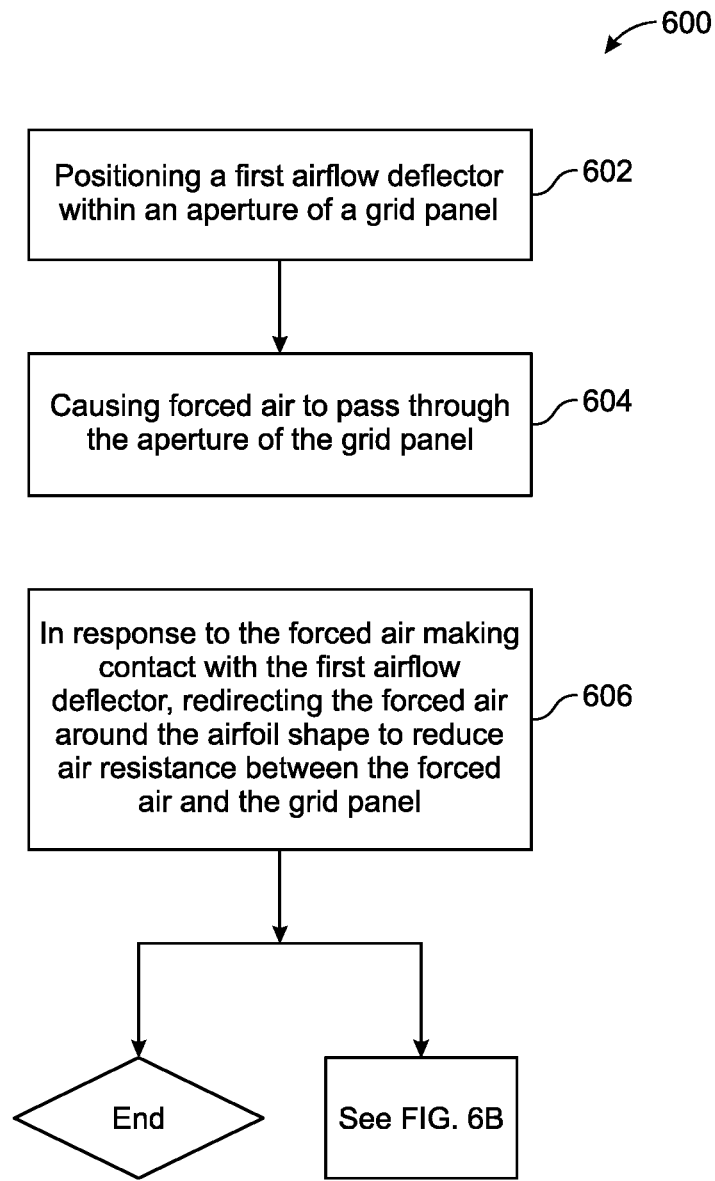
FIG. 6A is a flowchart illustrating an exemplary method for improving cooling of a heat-generating electronic device with a partition device, in accordance with certain aspects of the present disclosure.
Figure 6B:
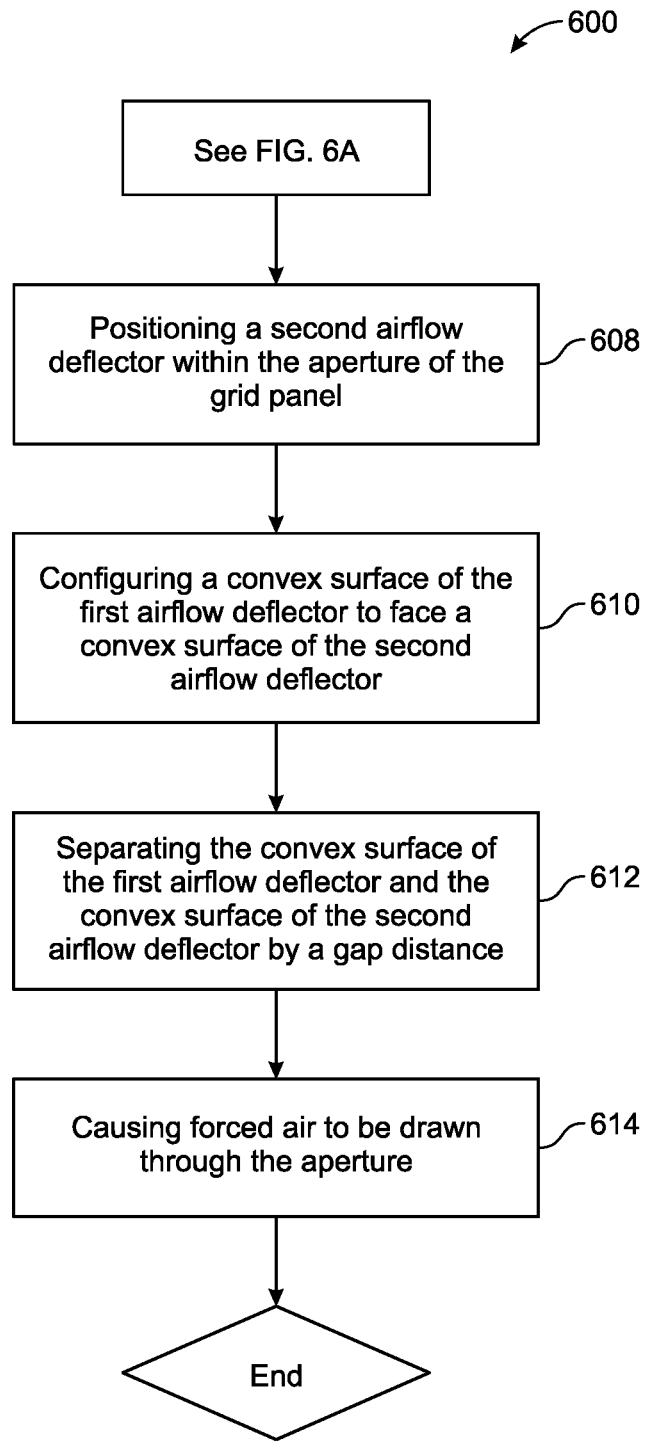
FIG. 6B is a continuation flowchart of FIG. 6B.

With reference to FIGS. 6A and 6B, an exemplary method 600 for improving cooling of a heat-generating electronic device with a partition device, in accordance with certain aspects of the present disclosure, is shown. It should be understood that the exemplary method 600 is presented solely for illustrative purposes, and that in other methods in accordance with the present disclosure can include additional, fewer, or alternative steps performed in similar or alternative orders, or in parallel.

Referring specifically to FIG. 6A, at step 602, the method begins with positioning an airflow deflector within an aperture of a grid panel located within a computer chassis. The airflow deflector has an airfoil shape. Next, at step 604, the air flow deflector causes forced air to pass through the aperture of the grid panel. At step 606, in response to the forced air making contact with the airflow deflector, the forced air is redirected around the airfoil shape to reduce air resistance between the forced air and the grid panel. According to some embodiments, the aperture of the grid panel has a shape that extends longitudinally along a surface of the grid panel with the surface of the grid panel being perpendicular to an airflow direction of the forced air. The foregoing steps allow the airflow deflectors to guide the forced air through the aperture 110 smoothly and mitigate disruption to airflow caused a sudden contraction and expansion of the airflow passageway. The method 600 could end at step 606 or to continue with steps 608 through 614.

Referring specifically to FIG. 6B, the method 600 further may include arranging the airflow deflectors to further improve airflow by creating a low-pressure region between two airflow deflectors and drawing forced air through the aperture from a region of higher air pressure to the low-pressure region. According to some embodiments, the airflow deflector described in step 602 matches a first airflow deflector and the method further includes step 608, positioning a second airfoil-shaped airflow deflector within the aperture of the grid panel. Next, at step 610, a convex surface of the first airflow deflector is configured to face a convex surface of the second airflow deflector. Moving on to step 612, the convex surfaces of the first airflow deflector and the second airflow deflector is separated by a gap distance. The gap distance should be configured to create a low-pressure region between the convex surfaces of the first airflow deflector and the second deflector. The low-pressure region should have a pressure lower than air pressure on a leading surface side of the grid panel. Lastly, on step 614, the low-pressure region draws the forced air through the aperture.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A partition device for improving cooling of a heat-generating electronic device, the partition device comprising:
   a grid panel having a plurality of apertures, the grid panel having a thickness extending between a leading surface and a trailing surface, the plurality of apertures extending parallel to an airflow direction of forced air flowing across the thickness of the grid panel and through the plurality of apertures;
   a first airflow deflector attached at least in part within one aperture of the plurality of apertures, the first airflow deflector having a first airfoil shape for reducing air resistance between the forced air and the grid panel, the first airfoil shape having a first leading edge that redirects initial contact with the forced air and that extends in a space in front of the leading surface, the first airfoil shape having a first trailing edge that continues redirecting the forced air and that extends in a space in rear of the trailing surface, the first leading edge being joined with the first trailing edge via two first convex surfaces, the two first convex surfaces being outwardly facing and symmetrical relative to a center line of the first airflow deflection; and
   a second airflow deflector attached adjacent to the first airflow deflector at least in part within a respective aperture of the plurality of apertures, the second airflow detector having a second airfoil shape, the second airfoil shape having a second leading edge that extends in a space in front of the leading surface, the second airfoil shape having a second trailing edge that extends in a space in rear of the trailing surface, the second leading edge being joined with the second trailing edge via a single second convex surface on one side and via a single flat surface on an opposite side;
   wherein the first and second airflow deflectors form an airflow path that includes a high-pressure region and a low-pressure region, the high-pressure region being formed between the first leading edge and the second leading edge, the low-pressure region being formed between the first trailing edge and the second trailing edge, the forced air being drawn from the high-pressure region to the low-pressure region through respective one or more of the plurality of apertures.

2. The partition device of claim 1, wherein the first airflow deflector has a length defined by distance of a chord line running from the first leading edge to the first trailing edge, and a thickness defined by longest distance between the two first convex surfaces of the first airflow deflector in a plane perpendicular to the chord line, a ratio of the length to the thickness being between about 1.01 and about 25.

3. The partition device of claim 1, wherein one or more of the plurality of apertures is an airflow aperture extending longitudinally along the leading surface and the trailing surface of the grid panel, the airflow aperture having a top, a midsection and a bottom.

4. The partition device of claim 1, wherein both the first airflow deflector and the second airflow deflector are attached in the same aperture of the plurality of apertures, the first airflow deflector being attached on one end of the same aperture, the second airflow deflector being attached at another end of the same aperture.

5. The partition device of claim 1, wherein the first airflow deflector is attached above the second airflow deflector.

6. The partition device of claim 1, wherein the first airflow deflector is attached below the second airflow deflector.

7. The partition device of claim 1, wherein the single second convex surface of the second airflow deflector is closer to the first airflow deflector than the single flat surface of the second airflow deflector.

8. The partition device of claim 1, wherein the first leading edge includes a blunt portion that is generally perpendicular to the airflow direction.

9. The partition device of claim 1, wherein the second leading edge includes a blunt portion that is generally perpendicular to the airflow direction.

* * * * *